United States Patent
Ries et al.

[11] Patent Number: 6,124,027
[45] Date of Patent: Sep. 26, 2000

[54] METHOD FOR MAKING POROUS ZEOLITIC FILMS

[76] Inventors: Paul D. Ries, 4205 Berkshire Ct., Midland, Mich. 48640; Michael M. Olken, 2700 Mt. Vernon Dr., Midland, Mich. 48642; Malcolm W. Warren, II, 1811 Eastlawn Dr., Apt. L-1, Midland, Mich. 48642-4828; Robert C. Dye, 310 Garver, White Rock, N. Mex. 87544

[21] Appl. No.: 08/237,484

[22] Filed: May 3, 1994

[51] Int. Cl.[7] .................................................. B05D 3/06
[52] U.S. Cl. .................................... 428/304.4; 428/318.4; 427/596
[58] Field of Search .......................... 428/304.4, 312.6, 428/312.8, 312.2, 318.4; 427/596

[56] References Cited

U.S. PATENT DOCUMENTS

| | | | |
|---|---|---|---|
| 5,015,492 | 5/1991 | Venkatesan et al. | 427/8 |
| 5,151,110 | 9/1992 | Bein et al. | 55/75 |
| 5,331,845 | 7/1994 | Bals et al. | 73/61.43 |

OTHER PUBLICATIONS

I. Boszormenyi et al./Model silica–alumina acid catalysts Catalysis Letters 10 (1991) 343–356.
William F. Maier et al., Adanced Materials 1993, 5, No. 10, 730–735.
Robert Pool, The Smallest Chemical Plants, vol. 263, Mar. 1994, 1698–1699.
Wm. F. Maier et al., Angew. Chem. Int. Ed. Engl. 30, 1991, Microporous Silica Films, 1509–1510.
Geoffrey A. Ozin et al., Angew. Chem. 101, 1989, Nr. 3, Advanced Materials, 373–390.
Geoffrey A. Ozin, Advanced Materials, 1992, 4, No. 10, Nanochemistry: Synthesis in Diminishing Dimensions.

*Primary Examiner*—Elizabeth M. Cole

[57] ABSTRACT

A vapor deposition method for coating a substrate with a porous zeolitic film. The method includes two steps. The first step is to irradiate a zeolite with a pulsed laser beam to vaporize the zeolite in a plume adjacent to the zeolite. The second step is to intercept the plume on the substrate to form the porous zeolitic film. A piezoelectric substrate can be used to produce a chemical sensor.

17 Claims, 1 Drawing Sheet

METHOD FOR MAKING POROUS ZEOLITIC FILMS

BACKGROUND

U.S. Pat. No. 5,015,492 to Venkatesan and Wu, issued May 14, 1991, herein fully incorporated by reference, disclosed a vapor deposition method and apparatus for coating a substrate with a thin layer of a complex material having a predetermined stoichiometric set of constituents. A pellet of the complex material was irradiated with, for example, a pulsed laser to produce a vapor plume of the complex material. A substrate was exposed to the plume to form the thin layer. The stoichiometry of the thin layer was essentially the same as the stoichiometry of the pellet.

U.S. Pat. No. 5,151,110 to Bein, Brown, Frye, and Brinker, issued Sep. 29, 1992, herein fully incorporated by reference, disclosed a sensor based on a piezoelectric substrate having a coating. The coating included a zeolite and a binder. The binder was needed to bind the zeolite to the piezoelectric substrate. The zeolite had a pore structure of substantially uniform pore diameters. The zeolite absorbed a specific chemical which could enter these pores but did not absorb a different chemical which could not enter these pores. If a specific chemical was absorbed by the zeolite, then the coating was heavier. The heavier coating was detected by the piezoelectric substrate.

The sensor of U.S. Pat. No. 5,151,110 was an important advance in the art but it was subject to an interference if the binder absorbed a chemical or if the binder tended to block the pores of the zeolite. It would be an advance in the zeolite coated piezoelectric substrate sensor art if a means could be found to form a zeolite coating on a piezoelectric substrate without a binder.

BRIEF DESCRIPTION OF THE INVENTION

An important benefit of this invention is a solution to the above stated problem with the binder. The invention can be used to form a zeolitic coating on a piezoelectric substrate with a binder. The invention can also be used to form a zeolitic film on other substrates to form, for example, improved gas separation membranes. The method includes two steps. The first step is to irradiate a zeolite with a pulsed laser beam of at least sufficient duration and intensity to vaporize said zeolite in a three-dimensional plume adjacent to the zeolite. The second step is to intercept the plume on a substrate, such as a piezoelectric substrate, to form the zeolitic film.

DETAILED DESCRIPTION OF THE INVENTION

Figure 1:
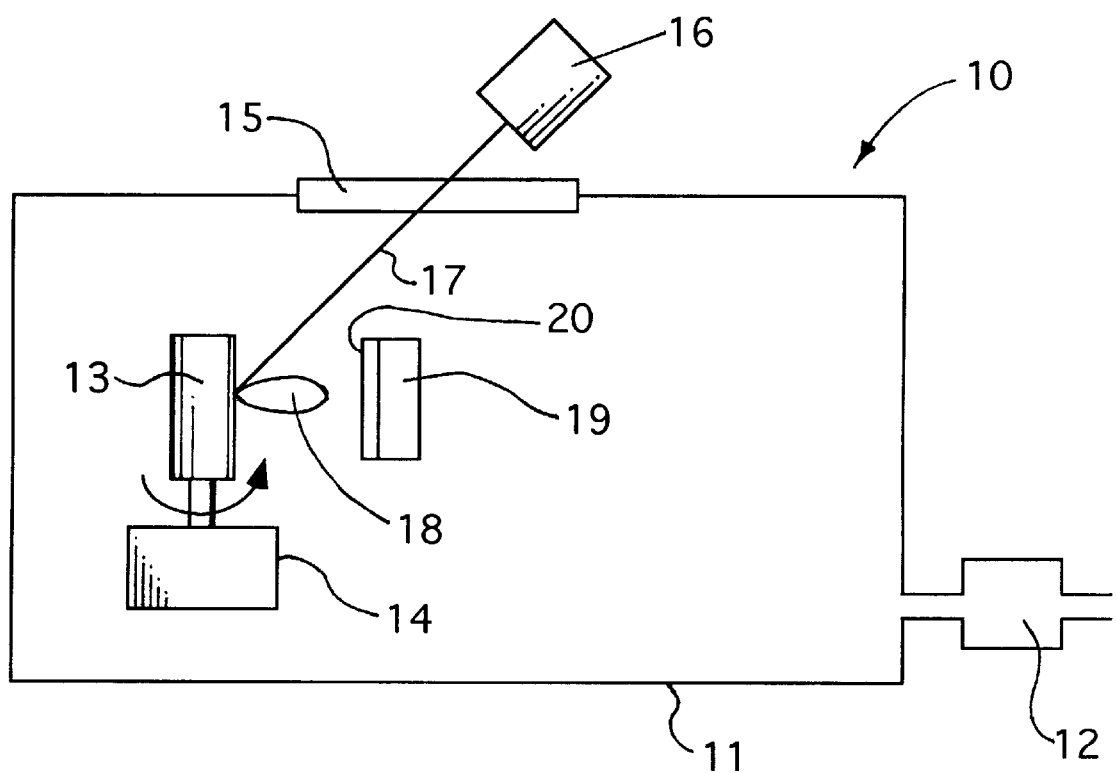
FIG. 1 is a schematic drawing of an apparatus for carrying out the method of this invention to make a chemical sensor.

Referring now to FIG. 1, therein is shown an apparatus 10 for carrying out the method of this invention to make a chemical sensor. The apparatus 10 includes a vacuum chamber 11 and an associated vacuum pump 12. A zeolite pellet 13 is mounted on a rotator 14 for rotating the zeolite pellet. The chamber 11 is equipped with a window 15. A laser 16 is used to direct pulsed laser beam 17 through the window 15 and onto the zeolite pellet 13. The duration and intensity of the pulsed laser beam 17 is sufficient to vaporize a small portion of the zeolite pellet 13 to produce a three-dimensional plume 18 of vaporized zeolite. A piezoelectric substrate 19 is positioned in the chamber 11 in front of the plume 18 so that the substrate 19 intercepts the plume 18 to form a zeolitic layer 20 on the substrate 19. Preferably, the zeolite is vaporized congruently as defined below. In addition, preferably the zeolite is also vaporized in such a manner that the pore size of the zeolite is reproduced as much as possible in the zeolitic film.

The chamber 11 can be operated at a relatively high vacuum of $1 \times 10^{-4}$ torr. However, it is more preferable to fill the chamber 11 with oxygen at a higher pressure, e.g., $2 \times 10^{-1}$ torr. A mixture of oxygen and water vapor at $2 \times 10^{-1}$ torr is also preferable in the chamber 11.

The term "zeolite" means any porous natural or synthetic ceramic crystalline material that has a substantially uniform pore structure. The diameter of the pores of a zeolite generally range from about 2.5 to about 12 Angstroms. However, zeolites with a pore size of up to ten nanometers have been reported, see Science, Vol. 26, Mar. 25, 1994, page 1699. Most zeolites are metal oxides. The pore size of most zeolites is defined by the number of metal/oxygen atoms forming a ring or rings in the zeolite crystal structure.

The term "zeolitic film" means the film that forms from the intersection of the plume of vaporized zeolite. Preferably, at least a portion of the pores of the zeolitic film have a pore size that is essentially the same as the pore size of the zeolite used to make the zeolite pellet so that the properties of the zeolitic film are, to some extent, predictable from the properties of the zeolite used to make the zeolite pellet. More preferably, the pores of the zeolitic film have a pore size that is substantially the same as the pore size of the zeolite used to make the zeolite pellet so that the properties of the zeolitic film are, to a greater extent, predictable from the properties of the zeolite used to make the zeolite pellet. However, even if the pores of the zeolitic film are essentially of a different size than the pores of the zeolite used to make the zeolite pellet, the zeolitic film is still useful as long as the zeolitic film is porous.

When the pores of the zeolitic film are essentially of a different size than the pores of the zeolite used to make the zeolite pellet, then the pore size selective properties of the zeolitic film will be different than the pore size selective properties of the zeolite used to make the zeolite pellet. It should be understood that these new properties are not necessarily poorer than the properties of the zeolite used to make the zeolite pellet. These new properties are best described as different and in some applications they will be better.

The term "congruently" means all the elements of the zeolite are vaporized at substantially the same time regardless of their respective vapor pressures and that the stoichiometry of the zeolitic film is substantially the same as the stoichiometry of the zeolite used to make the zeolite pellet. U.S. Pat. No. 5,015,492 discusses the subject of the duration and intensity of a pulsed laser beam necessary to obtain congruent vaporization of complex materials in general, see for example FIG. 3 thereof. However, it should be understood that this invention places the additional limitation that the zeolite film must be porous. Thus, the duration and intensity must be at least sufficient to preferably congruently vaporize the zeolite but the energy input should not be so large that the resulting zeolitic film is nonporous.

U.S. Pat. No. 5,015,492 provides many details for the vaporization of complex materials that will not be repeated here. However, it should be pointed out that it is preferable to form the zeolite pellet 13 under considerable pressure. An isostatic pressure of about ten to twenty thousand pounds per square inch works well for many zeolites. If the zeolite pellet 13 is formed at too low a pressure, then it tends to crumble excessively when it is irradiated. In addition, it can be helpful to boil a zeolite powder in water to form hydroxyl groups on the surface of the powder before the powder is dried and pressed into a pellet.

It is preferably to place a mask or aperture between the substrate 19 and the plume 18 so that only the central portion of the plume 18 is intercepted on the substrate 19. This technique is believed to increase the portion of the zeolitic film 20 that has the same pore size characteristics as the zeolite 13. This technique is similar to that disclosed in U.S. Pat. No. 5,015,492, see element 33 thereof, except, of course, that the object of the technique in this invention is more extensive, i.e., better maintenance of pore size characteristics as well as better congruency of vaporization.

U.S. Pat. No. 5,151,110 provides many details for zeolite coated piezoelectric substrate sensors that will not be repeated here. The following examples demonstrate the use of the zeolitic films discussed above for piezoelectric based sensors. However, it should be understood that the zeolitic films of this invention can be used for other applications than sensors. For example, the zeolitic films of this invention can be formed on a permeable substrate to form a semipermeable membrane. The semipermeable membranes of this invention can be formed with relatively thin discriminating zeolitic films that exhibit excellent selectivities between otherwise difficult to separate substances such as oxygen and nitrogen and excellent flux rates due to the relatively thin films that can be formed, e.g., ten Angstroms or less. The instant invention should also be useful in battery separators, fuel cell membranes, catalytic reactors, electrochromic devices, non linear optic devices and generally anywhere where a zeolite film would be useful.

EXAMPLE 1

One and one half gram of high silica mordenite zeolite powder is placed into a one and one eighth inch diameter steel die and pressed at a pressure of ten thousand pounds per square inch to form a pellet about one eighth inch thick. The pellet is then isostatically pressed at a pressure of ten thousand pounds per square inch.

An apparatus like that shown in FIG. 1 is assembled. The pellet is mounted on the rotator 14. No mask or aperture is used. The laser 16 is a YAG Q-switched laser having a wavelength of five hundred and thirty two nanometers, a five Hz pulse rate and a fluence of one to four Joules per square centimeter. A substrate 19 of single crystal silicon is placed five centimeters from the pellet 13.

The vacuum pump 12 is turned on and the pressure in the chamber 11 equilibrates at about $1\times10^{-4}$ torr. The laser 16 is turned on to generate successive plumes 18. The single crystal silicon substrate 19 is coated with a porous zeolitic film 20 wherein it is estimated that more than about ten percent of the pores are essentially the same size as the pores of the parent mordenite zeolite.

EXAMPLE 2

The same system is used as in Example 1, except that a mask or aperture is placed between the plume 18 and the substrate 19 to exclude the sides of the plume 18. In addition, a mass spectroscopic analysis is made of the central portion of the plume 18. The mass spectroscopic analysis indicates that the central portion of the plume 18 contains some fragments in excess of one thousand m/e.

EXAMPLE 3

The same system is used as in Example 2, except that the pressure in the chamber 11 is $2\times10^{-1}$ torr and is composed of oxygen. The mass spectroscopic analysis is made of the central portion of the plume 18. The mass spectroscopic analysis indicates that the central portion of the plume 18 contains more fragments in excess of one thousand m/e.

EXAMPLE 4

The same system is used as in Example 3, except that the substrate 19 is a ten MHz quartz microbalance crystal. The crystal is operated during the coating process to monitor the formation of the zeolitic film 20. It is estimated that the pores of the film 20 are substantially, i.e., more than fifty percent, essentially the same size as the pores of the parent mordenite zeolite.

EXAMPLE 5

The system of Example 4 is used except that high silica ZSM-5 zeolite is used to make the pellet 13. The capacity of the film 20 for n-hexane is about thirty five percent the capacity of the parent zeolite. The capacity of the film 20 for cyclohexane is about forty percent the capacity of the parent zeolite. It is therefore estimated that about one third of the pores of the film 20 are essentially the same size as the pores of the parent zeolite.

EXAMPLE 6

The system of Example 4 is used except that ALPO-5 zeolite is used to make the pellet 13. The capacity of the film 20 for n-hexane is about the same as the capacity of the parent zeolite. The capacity of the film 20 for cyclohexane is four and four tenths weight percent. It is theretofore estimated that more than about one half of the pores of the film 20 are essentially the same size as the pores of the parent zeolite.

EXAMPLE 7

The system of Example 1 is used except that ALPO-5 zeolite is used to make the pellet 13. The capacity of the film 20 for n-hexane is about one half the capacity of the parent zeolite. The capacity of the film 20 for cyclohexane is about one and seven tenths weight percent. It is theretofore estimated that less than about one half of the pores of the film 20 are essentially the same size as the pores of the parent zeolite.

EXAMPLE 8

The system of Example 4 is used except that the chamber 11 contains argon at a pressure of $1.5\times10^{-1}$ torr. The selectivity of the film 20 is about the same as the film 20 of Example 4. However, the n-hexane capacity is only seventy four percent of the film 20 of Example 4.

What is claimed is:

1. A vapor deposition method for coating a substrate with a porous zeolitic film, the method comprising the steps of:
    (a) irradiating a porous zeolite with a pulsed laser beam of at least sufficient duration and intensity to vaporize the zeolite in a three-dimensional plume adjacent to the zeolite; and
    (b) intercepting the plume on the substrate to form the porous zeolitic film.

2. The method of claim 1, wherein at least a portion of the pores of the porous zeolitic film are essentially the same size as the pores of the zeolite.

3. The method of claim 1, wherein the pores of the porous zeolitic film are substantially the same size as the pores of the zeolite.

4. The method of claim 2, wherein the zeolite is vaporized congruently.

5. The method of claim 3, wherein the zeolite is vaporized congruently.

6. The method of claim 4, wherein only a portion of the plume is intercepted on the substrate.

7. The method of claim 5, wherein only a portion of the plume is intercepted on the substrate.

8. The method of claim 6, wherein the zeolite is irradiated in an atmosphere composed primarily of oxygen.

9. The method of claim 7, wherein the zeolite is irradiated in an atmosphere composed primarily of oxygen.

10. A sensor, comprising:

(a) a piezoelectric substrate; and (b) a porous zeolitic film coated on the piezoelectric substrate, the porous zeolitic film formed by irradiating a porous zeolite with a pulsed laser beam of at least sufficient duration and intensity to vaporize the zeolite in a three-dimensional plume adjacent to the zeolite and then intercepting the plume on the substrate to form the porous zeolitic film, wherein at least a portion of the pores of the porous zeolitic film are essentially the same size as the pores of the zeolite.

11. The sensor of claim 10, wherein the pores of the porous zeolitic film are substantially the same size as the pores of the zeolite.

12. The sensor of claim 10, wherein the zeolite is vaporized congruently.

13. The sensor of claim 11, wherein the zeolite is vaporized congruently.

14. The sensor of claim 12, wherein only a portion of the plume is intercepted on the substrate.

15. The sensor of claim 13, wherein only a portion of the plume is intercepted on the substrate.

16. The sensor of claim 14, wherein the zeolite is irradiated in an atmosphere composed primarily of oxygen.

17. The sensor of claim 15, wherein the zeolite is irradiated in an atmosphere composed primarily of oxygen.

* * * * *